United States Patent [19]

Hulsey et al.

[11] Patent Number: 4,776,036

[45] Date of Patent: Oct. 4, 1988

[54] RF-AM TRANSMITTER WITH PULSE WIDTH MODULATOR

[75] Inventors: Gilmer L. Hulsey, Greenville, N.C.; Bryan A. Weaver, Dallas, Tex.

[73] Assignee: Varian Associates, Inc., Palo Alto, Calif.

[21] Appl. No.: 119,868

[22] Filed: Nov. 13, 1987

Related U.S. Application Data

[63] Continuation of Ser. No. 832,629, Feb. 5, 1986, abandoned.

[51] Int. Cl.[4] ............................................. H04B 1/04
[52] U.S. Cl. .................................. 455/108; 455/116; 332/9 R; 332/31 R; 375/22
[58] Field of Search ....................... 455/108, 109, 116; 375/22; 332/31 R, 37 R, 9 R; 330/10

[56] References Cited

U.S. PATENT DOCUMENTS

| | | | |
|---|---|---|---|
| 3,094,627 | 6/1963 | van Lottum | 307/88.5 |
| 3,335,370 | 8/1967 | Wittig et al. | 455/108 |
| 3,506,920 | 4/1970 | Swanson | 325/142 |
| 3,588,744 | 6/1971 | Swanson | 328/53 |
| 4,122,415 | 10/1978 | Luther, Jr. et al. | 332/37 R |
| 4,140,980 | 2/1979 | Cummings | 332/9 T |
| 4,186,346 | 1/1980 | Wysocki | 455/108 |
| 4,319,359 | 3/1982 | Wolf | 375/22 |
| 4,510,456 | 4/1985 | Swanson | 330/10 |

Primary Examiner—Michael A. Masinick
Attorney, Agent, or Firm—Stanley Z. Cole; John C. Yakes; Allen M. Lowe

[57] ABSTRACT

An RF-AM transmitter includes a pulse amplifier responsive to a pulse width modulated (PWM) signal derived in response to an information signal. A low pass filter converts pulses derived by the power amplifier into a variable amplitude signal that is DC coupled to a power supply for an RF amplifier. An amplifier system including the pulse and RF amplifiers has stray capacitance coupled to a modulator which derives the PWM signal; the stray capacitance lengthens narrow modulator output pulses so they are excessively long. The amplitude of only the narrow pulses is reduced by a resistor-capacitor timing circuit in series with a switch to substantially preserve the narrow pulse area. The switch provides a low impedance path from the timing circuit to a reference potential terminal when current initially flows in the circuit during pulse transitions and throughout the length of each of the short duration pulses. Thereby, the power amplifier is forward biased but not driven into saturation during the short duration pulses. The switch provides a higher impedance path from the timing circuit to the reference potential terminal after the transition has elapsed, enabling the power amplifier to be saturated during pulses longer than the short duration pulses. The RF power amplifier tube has a tendency to load the power amplifier tube out of saturation during wide pulses. The amplitude of the wide pulses is maintained substantially constant by a resistor shunted by an inductor between the modulator and the power amplifier.

15 Claims, 2 Drawing Sheets

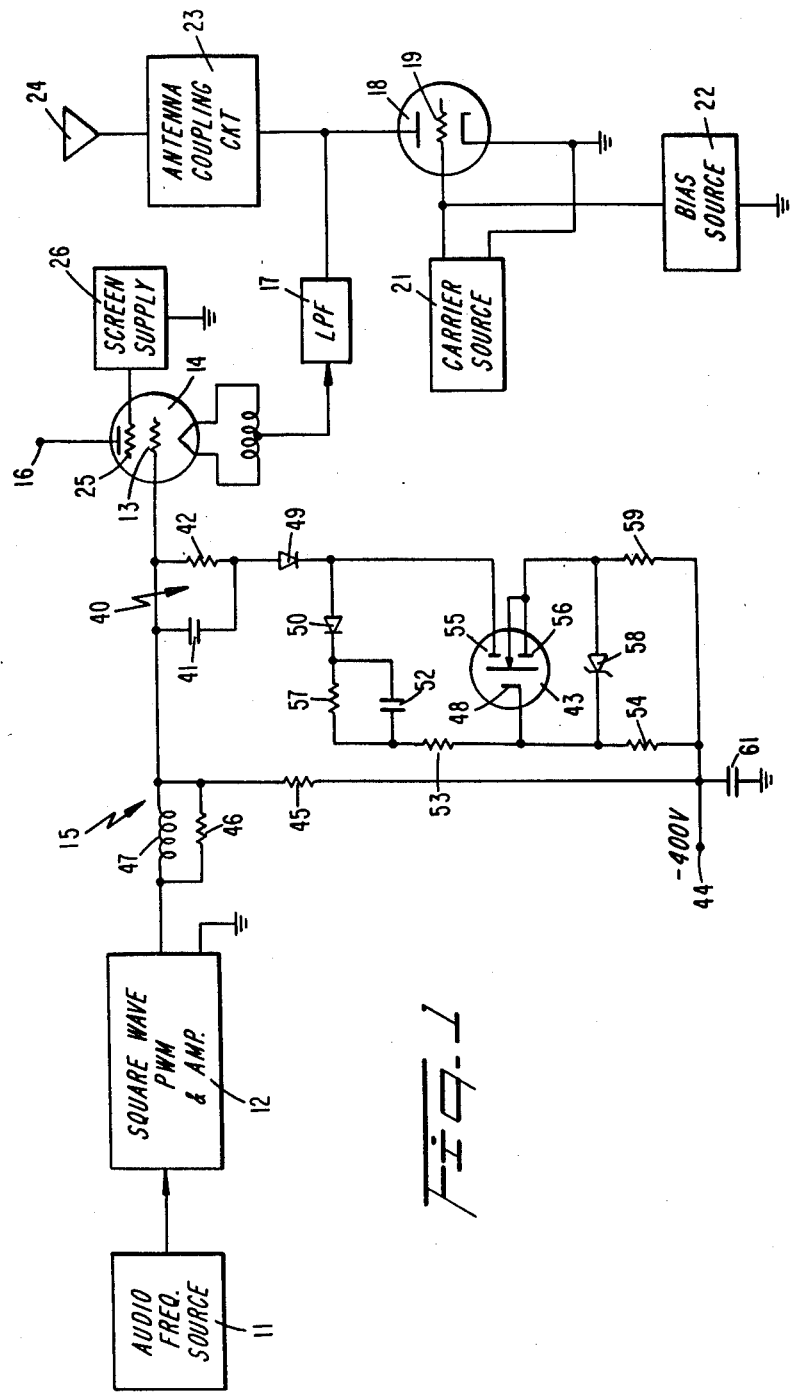

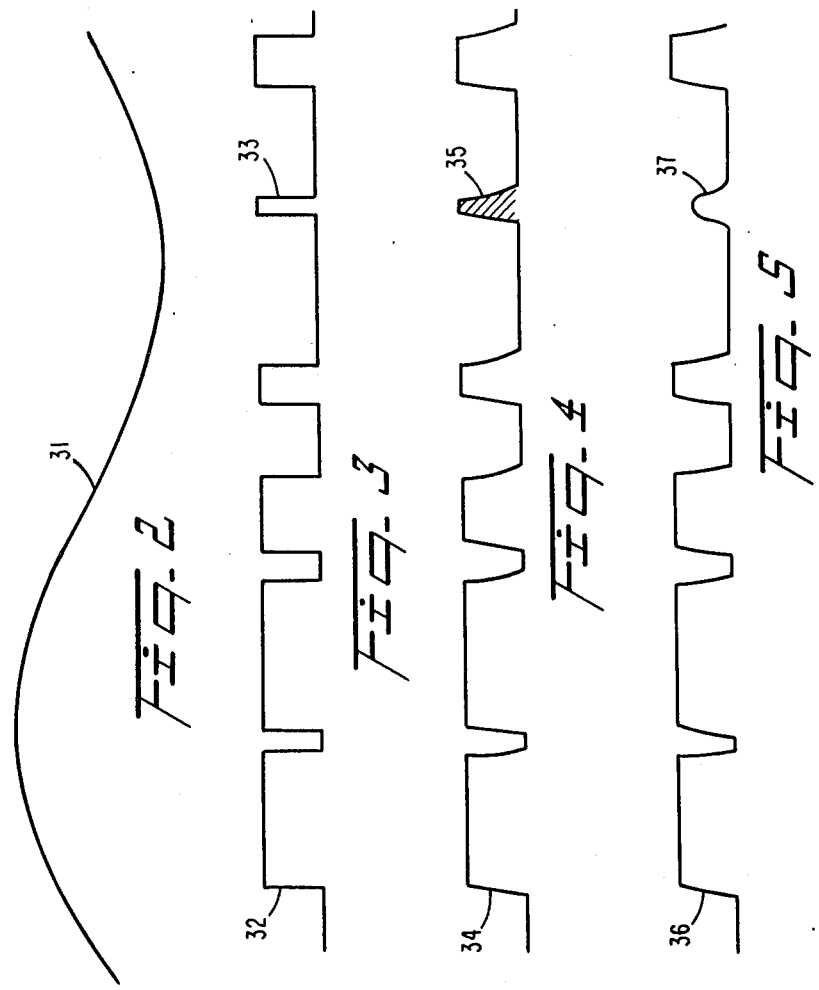

RF-AM TRANSMITTER WITH PULSE WIDTH MODULATOR

This is a continuation, of application Ser. No. 832,629, May 7, 1986, filed 2-5-86 now abandoned.

TECHNICAL FIELD

The present invention relates generally to RF-AM transmitters including pulse width modulators driving an RF amplifier by way of a DC circuit including a low pass filter and a power amplifier driven by a pulse width modulated information indicating signal. In one particular aspect of the invention, a tendency for stray capacity of an amplifier system including the power amplifier and the RF amplifier to lengthen the duration of short duration pulse width modulated pulses is overcome by reducing the amplitude of only short duration pulses applied to the power amplifier. In accordance with a further aspect of the invention, a tendency of the RF amplifier to load the power amplifier out of saturation during portions of pulses wider than the narrow pulses is overcome by coupling the pulse width modulated signal to the power amplifier grid by connecting a resistor shunted by an inductor between the output of the pulse width modulator and the power amplifier.

BACKGROUND ART

Swanson, U.S. Pat. Nos. 3,506,920 and 3,588,744 discloses a radio frequency (RF), amplitude modulated (AM) transmitter wherein a DC path is provided between an anode-cathode circuit of an RF amplifier responsive to an RF carrier and the anode-cathode path of a power amplifier responsive to a pulse width modulated information representing signal. A low pass filter is connected between the power amplifier and the RF amplifier to smooth the pulse width modulated wave driving the power amplifier into a variable amplitude signal that controls the power supply voltage for the RF amplifier anode-cathode circuit.

The amplifying system including the power amplifier and the RF amplifier of the Swanson patent has stray capacity, including the shunt (anode-cathode) capacitance of the power amplifier tube. The stray capacity causes narrow pulses driving the power amplifier grid to be increased in length, whereby the amplitude of an RF output of the RF amplifier has a tendency to be greater than it should be in response to these narrow width pulses. The power amplifier, being alternately driven into cutoff and saturation by the pulse width modulated signal applied to the grid thereof, causes an excessively high amplitude power supply voltage to be supplied to the RF amplifier anode-cathode path by the low pass filter in response to the lengthened short duration pulses.

While the stray capacity lengthens and therefore distorts all transitions and pulses of the pulse width modulated signal applied to the power amplifier grid, the amount of lengthening is insignificant for relatively wide pulses compared with the total area of such wide pulses. However, for shorter width pulses, which represent the information signal during high level modulation in each negative half-cycle, the distortion is usually appreciable.

In the Swanson patents, the distortion is, to a certain extent, compensated by including a low pass filter circuit in an amplifier driving the power amplifier. The low pass filter circuit includes a capacitor shunting the anode-cathode path of a pentode amplifier and a resistor shunted by an inductor in series between the plate of the pentode and a DC power supply circuit for the pentode. The low pass filter circuit reduces the amplitude of many of the pulses supplied to the power amplifier during each cycle of an information signal. In fact, the amplitude of only the very longest pulses remains constant in the prior art system disclosed in the Swanson patents.

Because the amplitude of many of the pulses supplied to the power amplifier tube grid of Swanson are reduced in amplitude, the efficiency of the transmitter is substantially reduced. This is because the amplifying system including the power amplifier and RF amplifier are operated most efficiently when the power amplifier is driven fully between cutoff and deep saturation.

It is, therefore, an object of the present invention to provide an RF, AM transmitter responsive to a pulse width modulated information representing signal, with a new and improved circuit for compensating for stray capacity effects of an amplifying system including a power amplifier and an RF amplifier.

Another object of the invention is to provide an RF, AM transmitter responsive to a pulse width modulated information representing signal for selectively reducing the magnitude of short duration pulses to compensate for stray capacity effects of an amplifying system, without changing the magnitude of longer pulses to enable the amplifying system to operate with greater efficiency since the power amplifier is more consistently driven between deep saturation and cutoff.

An additional object of the present invention is to provide an RF, AM transmitter responsive to a pulse width modulated information representing signal source wherein amplitude control of pulses applied to an amplifying system of the transmitter is restricted to short duration pulses in such a manner that the effect of stray capacity of the amplifying system to lengthen only the short duration pulses is obviated.

A further object of the invention is to provide an RF, AM transmitter including a power amplifier driving an anode-cathode circuit of an RF transmitting tube by way of a DC circuit including a low pass filter that converts a pulse width modulated information signal applied to a grid of the power amplifier into a variable amplitude modulating signal for the RF amplifier, wherein stray capacity of the amplifying system that has a tendency to distort the RF amplifier for low amplitude levels of the information signal is obviated by modifying the amplitude of only the short duration pulses.

DISCLOSURE OF INVENTION

In accordance with one aspect of the present invention, a radio transmitter for transmitting an RF carrier amplitude modulated by an information signal comprises a pulse width modulator responsive to the information signal for deriving a pulse width modulated signal having pulses with widths representing the amplitude of the information signal, wherein only pulses having widths less than a predetermined short duration are reduced in amplitude. An amplifying system includes a power amplifier responsive to the pulse width modulated signal and a variable impedance DC path forming part of a power supply circuit of an RF amplifier responsive to the carrier. The amplifying system includes a low pass filter for converting pulses derived by the power amplifier into a variable amplitude signal DC coupled to the RF amplifier.

Preferably the power and RF amplifiers respectively include first and second vacuum tubes so that an anode-cathode path of the first tube is connected in a B+ supply circuit for anode-cathode path of the second tube. The first tube is biased so it is driven between saturation and cutoff in response to the pulses being and not being derived by the pulse width modulator. The amplifier system has stray capacitance including shunt capacity of the first tube. The stray capacity causes transitions of the pulses coupled to the control grid of the first tube to be changed in shape so that narrow ones of said pulses have a tendency to be excessively long and have excessive energy to cause the carrier to have excessively high instantaneous amplitude. In accordance with the invention the amplitude of the narrow pulses is reduced so that the tendency thereof to have excessive energy is substantially obviated.

The amplitude of only the short duration pulses is reduced by shunting a grid of the first tube with a resistor-capacitor charging circuit. A switch responds to current flowing through the resistor-capacitor circuit to provide (a) a low impedance path from the grid to a reference potential terminal when current initially flows in the resistor-capacitor circuit during a transition in each of the pulses and throughout the length of each of the short duration pulses so that the power amplifier tube is forward biased but not driven into saturation during the short duration pulses, and (b) a higher impedance path from the grid to the reference potential after the transition and the time required for the short duration pulses so that the first tube is driven into saturation after the time required for the short duration pulses. Because the first tube is driven into saturation during all pulses longer than the short duration pulses, rather than only during the longest pulses, greater efficiency is provided by the present invention than is attained with Swanson.

The second tube, i.e., the tube included in the RF power amplifier, has a tendency to load the first tube out of saturation during latter portions of pulses considerably wider than the narrow pulses. This occurs when the second tube is driven to the maximum extent during the peak value of the low pass filter output amplitude modulating it, as occurs when the information signal has a maximum positive instantaneous amplitude. Because of the loading effect, there is a tendency for the first tube to be driven out of saturation when the information signal has the greatest instantaneous positive amplitude which causes the pulses applied to the first tube to have the greatest length. Hence, the carrier output of the RF amplifier has a tendency to have a lower amplitude than it should have at the time of the greatest power demand by the RF amplifier.

The present invention provides a means coupled to the amplifying system for maintaining the amplitude of the wider pulses substantially constant throughout the duration thereof so that the tendency of the wide pulses to not drive the power amplifier into saturation is substantially overcome. The circuitry for maintaining the amplitude of the wider pulses substantially constant throughout the duration thereof includes a resistor shunted by an inductor connected between the pulse width modulator output and the grid of the first tube. At the beginning of each pulse, the inductor has a relatively high impedance to the high frequency components in the transition and has no effect on the current flowing from the pulse width modulator to the grid of the first tube. After the length of time associated with a short duration pulse has elapsed, the impedance of the inductor decreases substantially and effectively short circuits the resistor, to supply a constant high level voltage and current to the grid of the first tube, to maintain the first tube in saturation.

The above and still further objects, features and advantages of the present invention will become apparent upon consideration of the following detailed description of one specific embodiment thereof, especially when taken in conjunction with the accompanying drawings.

BRIEF DESCRIPTION OF THE DRAWINGS

FIG. 1 is a partial circuit and partial block diagram of a preferred embodiment of the present invention; and FIGS. 2, 3, 4 and 5 are waveforms helpful in describing the operation of the circuit of FIG. 1.

BEST MODE FOR CARRYING OUT THE INVENTION

Reference is now made to FIG. 1 of the drawing wherein the preferred embodiment of the radio frequency, amplitude modulated transmitter of the invention is illustrated as including an audio frequency signal source 11 which drives square wave pulse width modulator and amplifier 12, having a high output impedance. Amplifier 12 drives grid 13 of power pulse amplifier tube 14 by way of pulse shaping network 15. Tube 14 has an anode-cathode path connected to B+ terminal 16 that is DC coupled by way of low pass filter 17 to the anode-cathode circuit of radio frequency power amplifier tube 18 having grid 19 connected to radio frequency carrier source 21 and to DC bias source 22. The anode-cathode circuit of tube 18 includes antenna coupling circuit 23 which is connected to antenna 24. Each of the elements illustrated in FIG. 1, except shaping circuit 15, is old in the art, as disclosed, for example, in the aforementioned Swanson patents.

Details of the operation of FIG. 1 are now described, assuming that pulse shaping circuit 15 is not provided.

Audio frequency source 11 can be any suitable source, such as speech, music, sinusoidal tones, square waves, triangular waves, or variations thereof. Several times during each cycle of source 11, square wave pulse width modulator and amplifier 12 derives a pulse having a duration that is a function of the instantaneous amplitude of source 11. The output of square wave pulse width modulator and amplifier 12 is a bilevel signal, having a constant positive voltage, alternating with zero voltage levels. Relatively long positive and zero voltage levels are derived at the output of square wave pulse width modulator and amplifier 12 in response to the instantaneous output of source 11 being high and low, respectively.

The bias voltage applied to grid 13 of power pulse amplifier tube 14 and the amplitude of the pulse output of square wave pulse width modulator and amplifier 12 are such that the anode-cathode path of tube 14 is alternately driven between hard saturation and cutoff. Thereby, a constant, relatively high current level flows from B+ terminal 16 through the anode-cathode path of tube 18 while a positive pulse amplitude is derived by square wave pulse width modulator and amplifier 12. In contrast, no current flows from B+ terminal 16 to low pass filter 17 while tube 14 is backbiased, i.e., cutoff, by the bias voltage applied to grid 13 at the time a zero voltage level is derived from square wave pulse width modulator and amplifier 12.

Low pass filter 17 responds to the variable duration relatively high current pulses supplied to it by way of the anode-cathode path of tube 13, to convert these current pulses into a relatively high current level that is supposed to be a replica of the current waveform of audio frequency source 11. The output of low pass filter 17 which is supposed to be replica of the waveform of audio frequency source 11 controls the impedance of the anode-cathode circuit of tube 18 and loading of antenna coupling circuit 23.

Preferably, the amplitudes of carrier source 21 and bias source 22 are such that tube 18 operates in Class C to provide maximum operating efficiency. It is to be understood, however, that carrier source 21 and bias source 22 can be connected to grid 19 in such a manner as to cause tube 18 to operate in Class AB or Class B operation.

Preferably, pulse power amplifier tube 14 is a tetrode, having a screen grid 25 appropriately energized by DC bias circuit 26. Despite the fact that power pulse amplifier tube 14 is a tetrode, it has appreciable shunt capacitance between the anode and cathode thereof. In addition, there is additional stray capacitance in the amplifier system including tubes 14 and 18 and the circuitry associated therewith. This stray capacity associated with the amplifying system is coupled back to the output terminals of square wave pulse width modulator and amplifier 12. As a result of the stray capacity at the output terminals of square wave pulse width modulator and amplifier 12, transitions in the output pulse waveform of square wave pulse width modulator amplifier 12 do not have the idealized vertical wave shape. The shortest duration pulses which are derived by circuit 12 during the maximum negative peak portions of the highest amplitude cycles of audio frequency source 11 have a tendency to be lengthened to such an extent that when they are smoothed or integrated by low pass filter 17 an inaccurate replica of the wave shape of audio frequency source 11 is applied as a modulating voltage for the anode-cathode path of tube 18.

An example of the effect of the short duration pulses is illustrated in the waveforms of FIGS. 2–4, based upon the assumption that audio frequency source 11 is deriving a sinusoidal wave shape, one cycle of which is illustrated as waveform 31, FIG. 2. Square wave pulse width modulator and amplifier 12 responds to waveform 31 to derive a pulse width modulated wave shape.

An idealized output waveform of circuit 12 in response to waveform 31 is illustrated in FIG. 3 as square wave 32. Square wave 32 has a zero base and vertical leading and trailing transitional edges and a constant amplitude high voltage level. In response to the positive half-cycle of sinusoidal waveform 31, square wave 32 has relatively long duration positive, constant amplitude levels, interspersed with short duration zero amplitude levels. As the amplitude of waveform 31 decreases, the durations of the positive and zero levels of square wave 32 respectively decrease and increase. When waveform 31 has a peak negative voltage, the durations of the positive portions of square wave 32 are much less than the durations of the zero amplitude levels of the square wave.

If it is assumed that shaping circuit 15 is not provided, the stray capacity of the amplifying system, as reflected to the output terminals of square wave pulse width modulator and amplifier 12, causes the output of the modulator and amplifier 12 to be distorted, as illustrated in FIG. 4 by waveform 34. From FIG. 4 it is noted that the vertical transitions of the leading and trailing edges of square wave 32 are converted into waveforms having appreciable slope. The slopes in the transitions of waveform 34 occur because the stray shunt capacity across the output terminals of modulator and amplifier 12 cannot respond instantly to the transitions of square wave 32. The sloping transitions of waveform 34 increase the area under each pulse, i.e., the area between the positive value of the pulse and the zero base line thereof.

Because the area under each of the pulses of waveform 34 is increased, the amplitude of the output of low pass filter 17 is not as accurate a replica of audio frequency source 11 as is desired. The amplitude modulated wave coupled to antenna 24 is thereby distorted, such that there is a greater amount of energy transmitted by the antenna to represent the instantaneous audio frequency source variations. The distortion is not particularly noticeable when information signal 31 has a high amplitude and the pulses derived by modulator and amplifier 12 are relatively long. This is because the percentage of the area added to these pulses due to the sloping transitions is not appreciable. However, for short duration pulses, i.e., pulses having a duration less than a predetermined interval, e.g. 10 microseconds, the percent distortion is enough to appreciably adversely affect the nature of the transmitted signal. In particular, pulse 33 in idealized square wave 32, as occurs in proximity to the minimum value of waveform 31, is distorted significantly, as indicated by distorted pulse 35. The area under the curve of pulse 35 is an appreciable percentage, such as 33%, greater than the area under idealized pulse 33.

In accordance with the present invention, shaping network 15 responds to the output of modulator and amplifier 12, as represented by waveform 34, to decrease the amplitude of only those short duration pulses having an area increase sufficiently great to cause significant distortion in the output of the AM wave transmitted from antenna 24. The amplitude decrease caused by circuit 15 is sufficient to cause power pulse amplifier tube 14 to be driven out of saturation, but not into cut-off, in response to the short duration pulses. Thereby, the current coupled by amplifier 14 to low pass filter 17 in response to each short duration output pulse of modulator and amplifier 12, when smoothed or integrated by filter 17, causes an accurate replica of source 11 to be coupled to the DC power supply for the anode-cathode circuit of tube 18 and antenna coupling circuit 23. Because power pulse amplifier tube 14 is driven to saturation by all output pulses of modulator and amplifier 12 other than those few pulses which have a short enough duration to cause appreciable distortion in the output of low pass filter 17, tube 14 is operated with optimum efficiency.

Circuit 15 thus responds to waveform 34 to derive waveform 36 (FIG. 5) which is coupled to grid 13 of power pulse amplifier tube 14. From waveform 36, it is noted that the amplitude of each pulse of waveform 34, except pulse 35, is preserved. The amplitude of pulse 35 is reduced, as indicated by pulse 37.

Circuit 15 basically includes a charging circuit 40 comprising the parallel combination of capacitor 41 and resistor 42 in shunt with the output of modulator and amplifier 12 and grid 13 of power pulse amplifier tube 14. Circuit 40 is connected to a switch in the form of the source drain path of field effect transistor 43. During each transition in the output of modulator and amplifier 12 and during each of the short duration pulses, such as pulse 35, switch 43 is closed to provide a low impedance path for the output of the modulator and amplifier, so that tube 14 is not driven into saturation. At the time associated with the short duration pulses terminating, switch 43 is open and the full output voltage of modulator and amplifier 12 is applied to grid 13.

In the preferred embodiment, the output of modulator and amplifier 12 varies between zero and +650 volts, and a negative 400 volt DC level at terminal 44 is connected via a variable impedance DC path to grid 13 of tube 14. The bias voltage at terminal 44 is DC coupled to grid 13 by way of bias resistor 45. Thereby, the anode-cathode path of amplifier tube 14 is maintained at cutoff while a zero level is derived from modulator and amplifier 12, but is driven into hard saturation because of the 250 volt positive bias applied across resistor 45 when the modulator and amplifier derives a high, 650 volt output level.

The voltage variations at the output of modulator and amplifier 12 are coupled to grid 13 by way of resistor 46, shunted by inductor 47, connected between grid 13 and the output of the modulator and amplifier. During transitions of the output of modulator and amplifier 12, the output of the modulator and amplifier is coupled to grid 13 by way of resistor 46; during this time, inductor 47 has a high impedance and effectively is an open circuit. During relatively long output pulses of modulator and amplifier 12, the impedance of inductor 47 decreases and the inductor becomes virtually a short circuit for resistor 46. Thereby, grid 13 is maintained in saturation, because of the increased voltage applied to the grid by the output of modulator and amplifier 12 in the latter portions of long duration output pulses of the modulator and amplifier.

Increasing the bias voltage applied to grid 13 for long duration pulses is necessary to maintain tube 14 in saturation. It is essential that tube 14 be driven to grid saturation to deliver long duration current pulses from B+ terminal 16 to low pass filter 17 and the anode-cathode circuit of tube 18 during intervals of minimum instantaneous plate voltage of tube 18, caused by the large positive amplitude AC carrier segments of source 21. This requirement causes large current loading of grid 13; the large grid current loading must be maintained throughout the length of the long pulses. The high current requirements of grid 13 cause a votage drop in resistor 46, which would result in tube 14 not being driven into saturation, except for the presence of inductor 47. As described supra inductor 47 effectively short circuits resistor 46 during the latter portions of the long duration pulses derived from modulator and amplifier 12. Maintaining tube 14 in saturation during the long current pulses is desirable because of the finite energy capabilities of the power supply connected to terminal 16. Because of the finite energy of the power supply connected to terminal 16, there is a tendency for the current supplied by tube 14 and the voltage at the input of low pass filter 17 to droop somewhat toward the end of long duration pulses. By increasing the forward bias applied by the output of modulator and amplifier 12 to grid 13 toward the end of these pulses, this drooping tendency is obviated.

Transitions in the output of modulator and amplifier 12 are coupled through capacitor 41 to gate 48 of FET 43 by way of diodes 49 and 50, capacitor 52 and a voltage divider including resistors 53 and 54. The forward bias voltage applied to gate 43 causes a low impedance to be provided between drain 55 and source 56 of FET 43, to provide a low impedance path for the current flowing through capacitor 41 and diode 49. The low impedance source drain path of field effect transistor 43 is maintained for a predetermined duration, equal to the duration of the shortest pulses in waveform 34 which are to be reduced in amplitude.

The voltage at gate 48 of field effect transistor 43 drops to a value which causes cutoff of the source drain path of the field effect transistor when circuit 40 has been charged by the output of modulator and amplifier 12 for an interval equal to the duration of the shortest pulses to be reduced in amplitude. As current flows through capacitor 41 with the source drain path of field effect transistor 43 in a low impedance state, current flows through capacitor 41 to charge the capacitor and cause the voltage across the capacitor to increase. The increased voltage across capacitor 41 causes the voltage and current supplied to the voltage divider including resistors 53 and 54 to decrease. When the voltage supplied by the voltage divider to gate 48 drops sufficiently, FET switch 43 is effectively open circuited and the impedance between drain 55 and source 56 increases. Open circuiting FET switch 43 removes a relatively low impedance load from the output of modulator and amplifier 12 and enables grid 13 to be driven into saturation. In other words, while the source drain path of FET 43 has a low impedance, the −400 volt bias at terminal 44 is coupled via a relatively low impedance path directly to grid 13 to prevent tube 14 from being driven into saturation by the 650 volt output of modulator and amplifier 12. When FET switch 43 is open circuited, the 650 volt output of modulator and amplifier 12 is applied to grid 13, to drive amplifier tube 14 into saturation.

The time constant of charge-discharge circuit 40, including capacitor 41 and resistor 42, determines the length of time FET switch 43 is forward biased. The time constant of circuit 40 is designed to be only as long as the narrow pulses which require shaping for distortion reduction. Because switch 43 is open circuited for virtually the entire length of the longer pulses, capacitor 41 remains charged throughout the duration of the longer pulses and has no significant effect on the amplitude or shape thereof.

To enable gate 48 of FET 43 to be forward biased in response to each positive going transition in the output of modulator and amplifier 12 the charge accumulated on capacitor 52 is drained through resistor 57, which shunts the capacitor. The voltage divider comprising resistors 53 and 54 provides the proper turn on or forward bias voltage for gate 48 of FET 43. Zener diode 58, shunting the gate drain path of FET 43, fixes the voltage between the gate and source and protects the FET. Resistor 59, connected between source 56 and terminal 44, provides a small amount of negative feedback for FET 43, to improve the performance thereof. Capacitor 61, in shunt with terminal 44, decouples the DC power supply connected to terminal 44 with the remaining circuitry, to prevent interaction between them. Resistor 45 is necessary because of the high impedance output of modulator and amplifier 12, to provide a return current path between grid 13 and terminal 44 and assure that tube 14 is cutoff. Diodes 49 and 50 are polarized so that positive current from modulator and amplifier 12 can flow through them to gate 48 and the source drain path of FET 43 in response to positive going transitions in the output of the modulator and amplifier, and to block current flow to the FET in response to negative going transitions in the output of the modulator and amplifier.

While there has been described and illustrated one specific embodiment of the invention, it will be clear that variations in the details of the embodiment specifically illustrated and described may be made without departing from the true spirit and scope of the invention as defined in the appended claims.

We claim:

1. A radio transmitter for transmitting an RF carrier amplitude modulated by an information signal comprising a pulse width modulator responsive to the information signal for deriving a pulse width modulated signal having pulses with widths representing the amplitude of the information signal, an amplifying system including a power amplifier including a first tube having a grid responsive to the pulse width modulated signal and an anode-cathode path DC coupled to an anode-cathode circuit of a second tube of an RF power amplifier, the RF power amplifier being responsive to the carrier, said amplifying system including low pass filter means for converting pulses derived by the first tube into a variable amplitude signal DC coupled to the anode-cathode circuit, means for biasing the first tube so it is driven between saturation and cutoff in response to transitions in the pulses derived by the pulse width modulator so the first tube is driven toward saturation while pulses are derived from the modulator and the first tube is at cutoff while no pulses are being derived from the modulator, the amplifier system having stray capacitance including shunt capacity of the first tube, the stray capacitance causing transitions of the pulses coupled to the grid to be changed in shape so that narrow ones of said pulses having a length less than a predetermined duration are excessively long for an accurate representation of the amplitude of the information signal and tend to distort the carrier to have excessively high instantaneous amplitude, means coupled to the amplifying system for reducing the amplitude of only said narrow pulses so that the tendency thereof to cause the carrier to have excessively high amplitude is substantially obviated, said RF power amplifier tube having a tendency to load said first tube out of saturation during portions of pulses wider than the narrow pulses subsequent to the narrow pulse lengths so that the wider pulses have a tendency to have an inadequate amplitude and cause the carrier to have lower amplitude than it should have, and means coupled to the amplifying system for maintaining the amplitude of said wider pulses at a level to maintain the first tube in saturation throughout the duration thereof so that the tendency of the carrier to have a lower amplitude than it should have is substantially overcome.

2. The transmitter of claim 1 wherein the amplitude reducing means includes a resistor-capacitor timing circuit and a switch controlled by said timing circuit in shunt with the grid, and the means for maintaining the amplitude of the wider pulses includes a resistor shunted by an inductor between the pulse width modulator and the grid.

3. The transmitter of claim 1 wherein the amplitude reducing means includes a resistor-capacitor timing circuit shunting the grid, switch means responsive to current flowing through said timing circuit for providing (a) a low impedance path from said timing circuit to a reference potential terminal when current initially flows in said timing circuit during a transition in each of said pulses and throughout the length of each of said short duration pulses so that the power amplifier tube is forward biased but not driven into saturation during said short duration pulses and (b) a higher impedance path from said timing circuit to the reference potential terminal after the transition so that the first tube is driven into saturation during pulses longer than said short duration pulses.

4. The transmitter of claim 2 wherein the switch means includes a path in series with said timing circuit and a control terminal for controlling opening and closing of said path, means for coupling current from said timing circuit to said control terminal so that said path of the switch means is closed in response to initial relatively high current flowing in said timing circuit during said transitions and is open in response to the relatively low current flowing in the circuit after the transition and the duration of the short pulse have occurred.

5. The transmitter of claim 1 wherein the amplitude reducing means includes a resistor-capacitor timing circuit responsive to transitions and pulses derived from said modulator, switch means responsive to current flowing through said timing circuit for providing (a) a low impedance path from said grid to a reference potential terminal when current initially flows in said timing circuit during a transition in each of said pulses and throughout the length of each of said short duration pulses so that the power amplifier tube is forward biased but not driven into saturation during said short duration pulses and (b) a higher impedance path from said grid to the reference potential terminal after the transition so that the first tube is driven into saturation during pulses longer than said short duration pulses.

6. A radio transmitter for transmitting an RF carrier amplitude modulated by an information signal comprising a pulse width modulator responsive to the information signal for deriving a pulse width modulated signal having pulses with widths representing the amplitude of the information signal, an amplifying system including a power amplifier including a first tube having a grid responsive to the pulse width modulated signal and an anode-cathode path DC coupled to an anode-cathode circuit of a second tube of an RF power amplifier, the RF power amplifier being responsive to the carrier, said amplifying system including low pass filter means for converting pulses derived by the first tube into a variable amplitude signal DC coupled to the anode-cathode circuit, means for biasing the first tube so it is driven between saturation and cutoff in response to transitions in the pulses derived by the pulse width modulator so the first tube is driven toward saturation while pulses are derived from the modulator and the first tube is at cutoff while no pulses are being derived from the modulator, the amplifier system having stray capacitance including shunt capacity of the first tube, the stray capacitance causing transitions of the pulses coupled to the grid to be changed in shape so that narrow ones of said pulses having a length less than a predetermined duration are excessively long for an accurate representation of the amplitude of the information signal and tend to distort the carrier to have excessively high instantaneous amplitude, and means coupled to the amplifying system for reducing the amplitude of only said narrow pulses so that the tendency thereof to cause the carrier to have excessively high amplitude is substantially obviated.

7. The transmitter of claim 6 wherein the amplitude reducing means includes a resistor-capacitor timing circuit connected to respond to the transitions and pulses derived by the modulator, switch means responsive to current flowing through said timing circuit for providing (a) a low impedance path from said grid to a reference potential terminal when current initially flows in said timing circuit during a transition in each of said pulses and throughout the length of each of said short duration pulses so that the power amplifier tube is forward biased but not driven into saturation during said short duration pulses and (b) a higher impedance path from said grid to the reference potential terminal after the transition so that the first tube is driven into saturation during pulses longer than said short duration pulses.

8. The transmitter of claim 7 wherein the timing circuit and the switch means both are in shunt with the grid.

9. The transmitter of claim 8 wherein the switch means includes a path in series with said timing circuit and a control terminal for controlling opening and closing of said path, means for coupling current from said timing circuit to said control terminal so that said path of the switch means is closed in response to initial relatively high current flowing in said timing circuit during said transitions and said short duration pulses and is open in response to the relatively low current flowing in the circuit after the transition and short duration pulse interval have been completed.

10. The transmitter of claim 8 wherein the switch means includes a field effect transistor having a gate connected to respond to current flowing in the resistor-capacitor circuit and a source drain path for providing the high and low impedance paths, diode means connected between the circuit and the gate for coupling positive going ones of said transistions to the gate and for preventing coupling of negative going ones of said transitions to the gate, another capacitor shunted by another resistor connected between said diode means and the gate, a resistive voltage divider having a tap connected to the gate and connected to be responsive to current flowing through said another capacitor, and a zener diode connected between one electrode of said source drain path and the gate for fixing the voltage between them.

11. A radio transmitter for transmitting an RF carrier amplitude modulated by an information signal comprising a pulse width modulator responsive to the information signal for deriving a pulse width modulated signal having pulses with widths representing the amplitude of the information signals, an amplifying system including a pulse power amplifier responsive to the pulse width modulated signal and a variable impedance path for DC biasing an RF amplifier, the RF amplifier being responsive to the carrier, said amplifying system including low pass filter means for converting pulses derived by the power amplifier into a variable amplitude DC bias for the RF amplifier, the amplifier system having stray capacity causing transitions of the pulses coupled to a control electrode of the pulse power amplifier to be changed in shape so that narrow ones of said pulses having a length less than a predetermined duration are excessively long for an accurate representation of the amplitude of the information signal and tend to distort the carrier to have excessively high instantaneous amplitude, and means coupled to the amplifying system for reducing the amplitude of only said narrow pulses so that the tendency thereof to cause the carrier to have excessively high amplitude is substantially obviated.

12. The transmitter of claim 11 wherein the amplitude reducing means includes a resistor-capacitor timing circuit and a switch controlled by said circuit, said switch being in shunt with the electrode of said pulse power amplifier for reducing the amplitude of current supplied by the power amplifier to the low pass filter during said short duration pulses relative to the amplitude of constant current supplied by the power pulse amplifier to the filter during pulses longer than the short duration pulses.

13. The transmitter of claim 11 wherein the amplitude reducing means includes a resistor-capacitor timing circuit responsive to transitions and the short duration pulses derived from the modulator, switch means responsive to current flowing through said timing circuit for providing (a) a low impedance path from the electrode of said pulse power amplifier to a reference potential terminal when current initially flows in said timing circuit during a transition in each of said pulses and throughout the length of each of said short duration pulses so that the pulse power amplifier is forward biased but not driven into saturation during said short duration pulses and (b) a higher impedance path from said control electrode to the reference potential terminal after the transition so that the pulse power amplifier is driven into saturation during pulses longer than said short duration pulses.

14. The transmitter of claim 13 wherein the timing circuit is in shunt with said electrode and the switch means includes a path in series with said circuit and a control terminal for controlling opening and closing of said path, means for coupling current from said timing circuit to said control terminal so that said path is closed in response to initial relatively high current flowing in said timing circuit during said transitions and is open in response to the relatively low current flowing in the timing circuit after the transition and the duration of the short pulse have occurred.

15. The transmitter of claim 13 wherein the timing circuit is in shunt with said electrode and the switch means includes a field effect transistor having a gate connected to respond to current flowing in the timing circuit and a source drain path for providing the high and low impedance paths, diode means connected between the timing circuit and the gate for coupling positive going ones of said transitions to the gate and for preventing coupling of negative going ones of said transistions to the gate, another capacitor shunted by another resistor connected between said diode means and the gate, a resistive voltage divider having a tap connected to the gate and connected to be responsive to current flowing through said another capacitor, and a zener diode connected between one electrode of said source drain path and the gate for fixing the voltage between them.

* * * * *